(12) United States Patent
Peter et al.

(10) Patent No.: US 10,171,130 B2
(45) Date of Patent: * Jan. 1, 2019

(54) RECEIVER CIRCUIT

(71) Applicant: Power Integrations, Inc., San Jose, CA (US)

(72) Inventors: Matthias Peter, Orpund (CH); Jan Thalheim, Biel-Bienne (CH)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/699,803

(22) Filed: Sep. 8, 2017

(65) Prior Publication Data

US 2017/0373722 A1 Dec. 28, 2017

Related U.S. Application Data

(63) Continuation of application No. 15/184,583, filed on Jun. 16, 2016, now Pat. No. 9,780,838.

(30) Foreign Application Priority Data

Jul. 8, 2015 (EP) ..................................... 15175944

(51) Int. Cl.
*H04B 5/00* (2006.01)
*H04B 1/06* (2006.01)
(Continued)

(52) U.S. Cl.
CPC ........... *H04B 5/0031* (2013.01); *H03F 3/193* (2013.01); *H03K 5/04* (2013.01); *H04B 1/16* (2013.01);
(Continued)

(58) Field of Classification Search
CPC . H04B 1/16; H04B 5/02; H04B 10/60; H04B 10/6931; H04B 10/697
(Continued)

(56) References Cited

U.S. PATENT DOCUMENTS 7,688,140 B2 3/2010 Yuasa
7,825,764 B2 11/2010 Feldtkeller
(Continued)

FOREIGN PATENT DOCUMENTS

DE   102 62 270 B4   11/2012
EP     1855297 A1    11/2007

OTHER PUBLICATIONS

European Patent Application No. 15175944.6—European Search Report, dated Jan. 20, 2016, 5 pages.
(Continued)

*Primary Examiner* — Quochien B Vuong
(74) *Attorney, Agent, or Firm* — Christensen O'Connor Johnson Kindness PLLC

(57) ABSTRACT

An analog receiver frontend includes a first amplification circuit coupled to receive an input signal. The first amplification stage is coupled to amplify a difference between the input signal and a threshold to generate the first signal. A second amplification circuit is coupled to receive the first signal from the first amplification circuit. The second amplification circuit is coupled to amplify the first signal to generate a second signal. An output circuit is coupled to receive the second signal from the second amplification circuit. The output circuit is coupled to output a recovered signal. The recovered signal is a pulse waveform of high and low sections. An input hysteresis circuit is coupled to the output circuit to receive the recovered signal and generate a hysteresis signal. One or both of the input signal and the
(Continued)

threshold are level shifted by the hysteresis signal in response to the recovered signal.

19 Claims, 10 Drawing Sheets

(51) Int. Cl.
    *H03K 5/04*     (2006.01)
    *H04L 25/02*     (2006.01)
    *H03F 3/193*     (2006.01)
    *H04B 1/16*     (2006.01)
    *H03K 17/691*     (2006.01)

(52) U.S. Cl.
    CPC ....... *H04B 5/0081* (2013.01); *H04L 25/0266* (2013.01); *H03F 2200/165* (2013.01); *H03F 2200/451* (2013.01); *H03F 2200/72* (2013.01); *H03K 17/691* (2013.01)

(58) Field of Classification Search
    USPC .............. 455/41.1, 41.2, 232.1, 234.1, 242.1
    See application file for complete search history.

(56) References Cited

U.S. PATENT DOCUMENTS

| | | |
|---|---|---|
| 8,019,393 B2 | 9/2011 | Lai |
| 2003/0001644 A1 | 1/2003 | Chao et al. |
| 2003/0151442 A1 | 8/2003 | Strzalkowski |
| 2006/0094384 A1 | 5/2006 | Rouphael et al. |
| 2006/0234647 A1 | 10/2006 | Kerselaers |
| 2006/0276155 A1 | 12/2006 | Feldtkeller |
| 2013/0189926 A1 | 7/2013 | Bangs et al. |
| 2017/0019090 A1 | 1/2017 | Honda et al. |

OTHER PUBLICATIONS

European Patent Application No. 15175944.6—European Office Action, dated Feb. 5, 2016, 7 pages.
European Patent Application No. 15175944.6—European Office Action, dated Nov. 4, 2016, 7 pages.
EiceDRIVER™, Final Data Sheet: 1ED020I12-F2—Single IGBT Driver IC (Rev. 2.0, Aug. 1, 2011), © 2011 Infineon Technologies AG, Munich, 28 pages.
European Patent Application No. 18171063.3—European Office Action, dated Sep. 6, 2018, 10 pages.
M. Munzer et al: "Insulated signal transfer in a half bridge driver IC based on Corel ess transformer technology". Proceedings / The Fifth International Conference on Power Electronics and Drive Systems. PEDS 2003 : Nov. 17-20, 2003. Novotel Apollo Hotel. Singapore, vol. 1. Nov. 17, 2003 (Nov. 17, 2003), pp. 93-96.

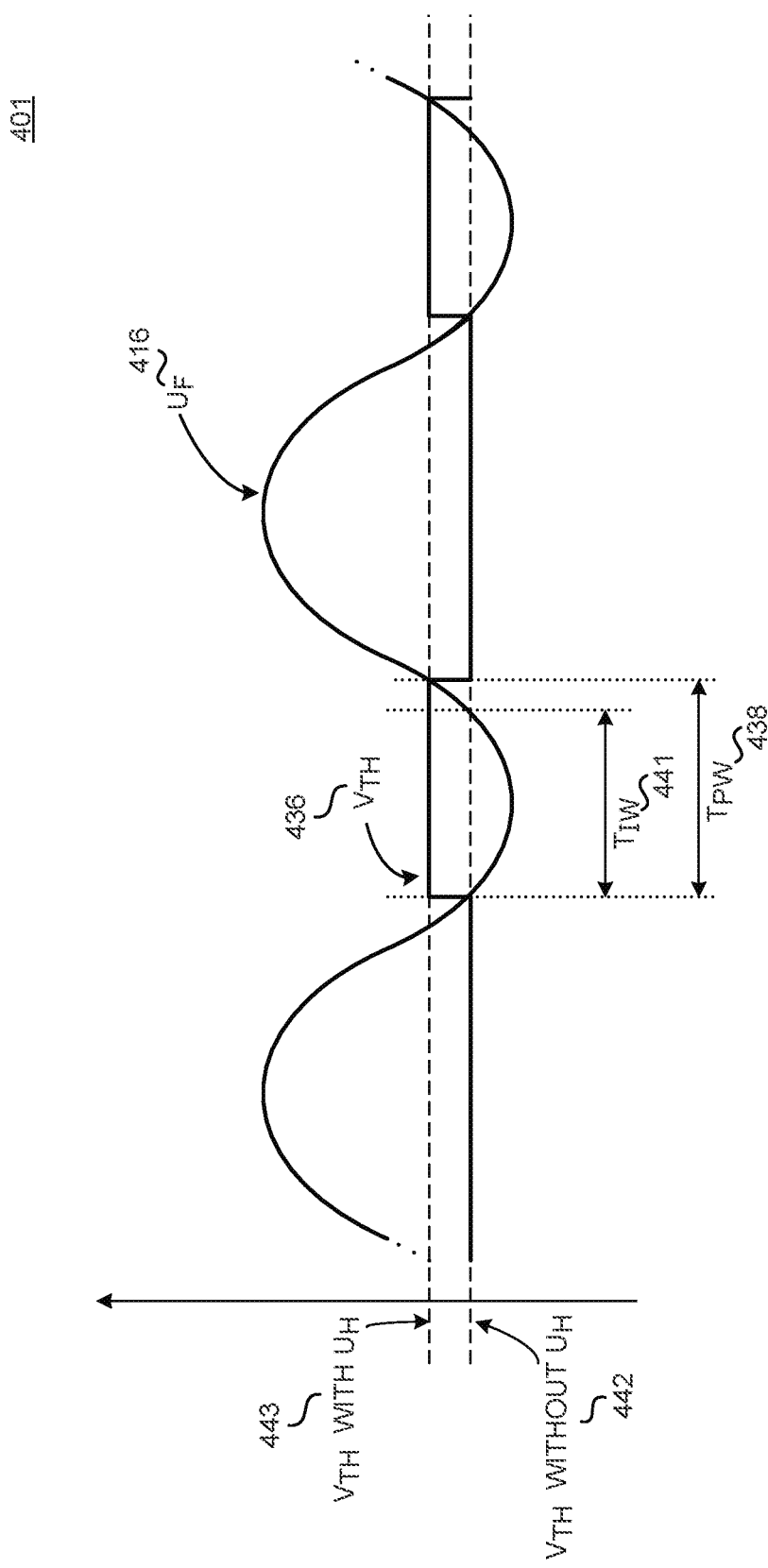

RECEIVER CIRCUIT

REFERENCE TO RELATED APPLICATIONS

This application is a continuation of and claims priority to U.S. patent application Ser. No. 15/184,583, filed Jun. 16, 2016, now pending, which claims priority to European Patent (EP) Application No. 15175944.6, filed on Jul. 8, 2015. U.S. patent application Ser. No. 15/184,583 and EP Application No. 15175944.6 are hereby incorporated by reference.

BACKGROUND OF THE INVENTION

1. Field of the Invention

The present invention relates generally to communication between circuits that use galvanic isolation, and more specifically to communication across an isolation barrier in switch mode power converters.

2. Discussion of the Related Art

Electrical devices in many contexts include a communication system that sends information between a transmitter and a receiver that are galvanically isolated and referenced to different ground potentials. Examples include power converters, medical equipment, marine equipment, and the like.

One such communication system uses magnetically coupled wires to send information between a transmitter and a receiver. Otherwise also known as an inductive coupling, a varying current flowing through a transmitting conductor induces a voltage across the ends of a receiving conductor. The coupling between the conductors can be strengthened in various ways. For example, conductive wires may be formed into coils with or without a magnetic core. Examples of inductive couplings include a transformer and a coupled inductor.

Despite the magnetically coupling of such conductors, the conductors can remain electrically isolated from each other so that a voltage difference can be applied without significant electrical conduction therebetween. However, so long as the magnetic coupling between the conductors is sufficiently strong, information can be conveyed across this electrical isolation.

SUMMARY

In one aspect, a data communications receiver includes a receiver coil; a first amplification stage coupled to the receiver coil, the first amplification circuitry to amplify a difference between a) at least part of signal received by the receiver coil and b) a threshold; a second amplification stage coupled to receive the amplified difference from the first amplification stage, the second amplification stage comprising a current mirror, and hysteretic level shifting circuitry to shift a level of a) part of the signal received by the receiver coil, b) the threshold, or c) part of the signal received by the receiver coil and the threshold. In response to the at least part of the signal received by the receiver coil having crossed the threshold, a threshold crossing in the other direction is delayed.

In another aspect, a data communications receiver includes a receiver coil; filter circuitry coupled to filter low frequency components from a signal received by the receiver coil and output a filtered signal; amplification circuitry coupled to receive the filtered signal and to amplify differences between the filtered signal relative to a threshold; and hysteretic level shifting circuitry to shift a level of a) part of the filtered signal received by the receiver coil, b) the threshold, or c) both part of the filtered signal and the threshold. In response to the filtered signal having crossed the threshold, a threshold crossing in the other direction is delayed.

In yet another aspect, a data communications receiver includes a receiver coil; a first amplification stage coupled to the receiver coil, the first amplification circuitry to amplify a difference between a) at least part of signal received by the receiver coil and b) a threshold; a current amplification circuit having an input coupled to receive the amplified difference from the first amplification stage; hysteretic level shifting circuitry to shift a level of a) part of the filtered signal received by the receiver coil, b) the threshold, or c) both part of the filtered signal and the threshold such that, in response to the at least part of the signal received by the receiver coil having crossed the threshold, a threshold crossing in the other direction is delayed. The current amplification circuit comprises a first MOSFET and a second MOSFET. The first MOSFET has a control terminal, a first of the source/drain coupled to the input of the current amplification circuit, and a second of the source/drain coupled to a first reference potential. The second MOSFET has a control terminal coupled to the input of the current amplification circuit, a first of the source/drain coupled to the output of the current amplification circuit, and a second of the source/drain coupled to a second reference potential. In operation, the control terminal of the first MOSFET is biased so that the first MOSFET remains in a conductive state.

These and other aspects can include one or more of the following features. The current mirror can have an input coupled to receive the amplified difference from the first amplification stage. The current mirror can include a first MOSFET having a control terminal, a first of the source/drain coupled to the input of the current amplification circuit, and a second of the source/drain coupled to a first reference potential. The current mirror can include a second MOSFET having a control terminal coupled to the input of the current amplification circuit, a first of the source/drain coupled to the output of the current amplification circuit, and a second of the source/drain coupled to a second reference potential. In operation, the control terminal of the first MOSFET is biased so that the first MOSFET remains in a conductive state.

The amplification circuitry can include a first amplification stage coupled to amplify a difference between the filtered signal and the threshold and a second amplification stage coupled to receive the amplified difference from the first amplification stage. The second amplification stage can include a current mirror. The current mirror can have an input coupled to receive the amplified difference from the first amplification stage. In various aspects, the first reference potential can be the same as the second reference potential, a negative supply potential of the data communications receiver, or at least part of the signal received by the receiver coil. The control terminal of the first MOSFET can be coupled to the input of the current amplification circuit. The first and second MOSFETs can form a linear current mirror.

The data communications receiver can include filter circuitry coupled to filter low frequency components from the signal received by the receiver coil and output a filtered signal to the first amplification stage. The filter circuitry can include a capacitance coupling the receiver coil to the first amplification stage. The capacitance of the filter circuitry can include a gate capacitance of a MOSFET. The filter circuitry can include a resistance coupled to a reference potential. The hysteretic level shifting circuitry can shift the level of the potential across the resistance.

The hysteretic level shifting circuitry can include a variable current source coupled to output a variable current to shift the level of the potential across the resistance. The first amplification stage can include a common gate amplifier. The common gate amplifier can include a first transistor having a source coupled to the threshold. The first differential amplification stage can include NMOS transistors. The data communications receiver can include a variable resistance coupled between an input of the common gate amplifier and a reference potential. The hysteretic level shifting circuitry can be coupled to vary the resistance of the variable resistance to shift the level of the threshold. The threshold and the shift in the level can be configured so that, for a transmitted signal having a duty cycle of 50%, a duty cycle of the amplified difference is between 35% and 65%, for example, between 40% and 60%.

The data communications receiver can include an output circuit coupled to receive an amplified version of the difference between the at least part of signal received by the receiver coil and the threshold. The output circuit can be coupled to output a binary state signal representing the difference.

The hysteretic level shifting circuitry can shift the level in response to a state change in the binary state signal. The hysteretic level shifting circuitry can shift the level of at least part of the signal received by the receiver coil. The hysteretic level shifting circuitry can shift the level in response to the signal having dropped below the threshold. The receiver coil can include a portion of a lead frame, a bondwire, and/or surface metallization. The receiver coil can have an inductance of 50 nH or less, e.g., 20 nH or less.

A power converter can include the data communications receiver according to any of the preceding aspects. Such a power converter can include a transmitter coil magnetically coupled to the receiver coil; and a pulse generator coupled to output pulses across the transmitter coil. The pulse generator can be configured to generate pulses having a duration of 10 nS or less, e.g., 5 nS or less. The transmitter coil can have an inductance of 50 nH or less, e.g., 20 nH or less. The power converter can include an insulated gate bipolar transistor power switch.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4B is a timing diagram illustrating an example waveform of the filtered signal of the analog receiver frontend of FIG. 3B, in accordance with the teachings of the present invention.

Figure 1:
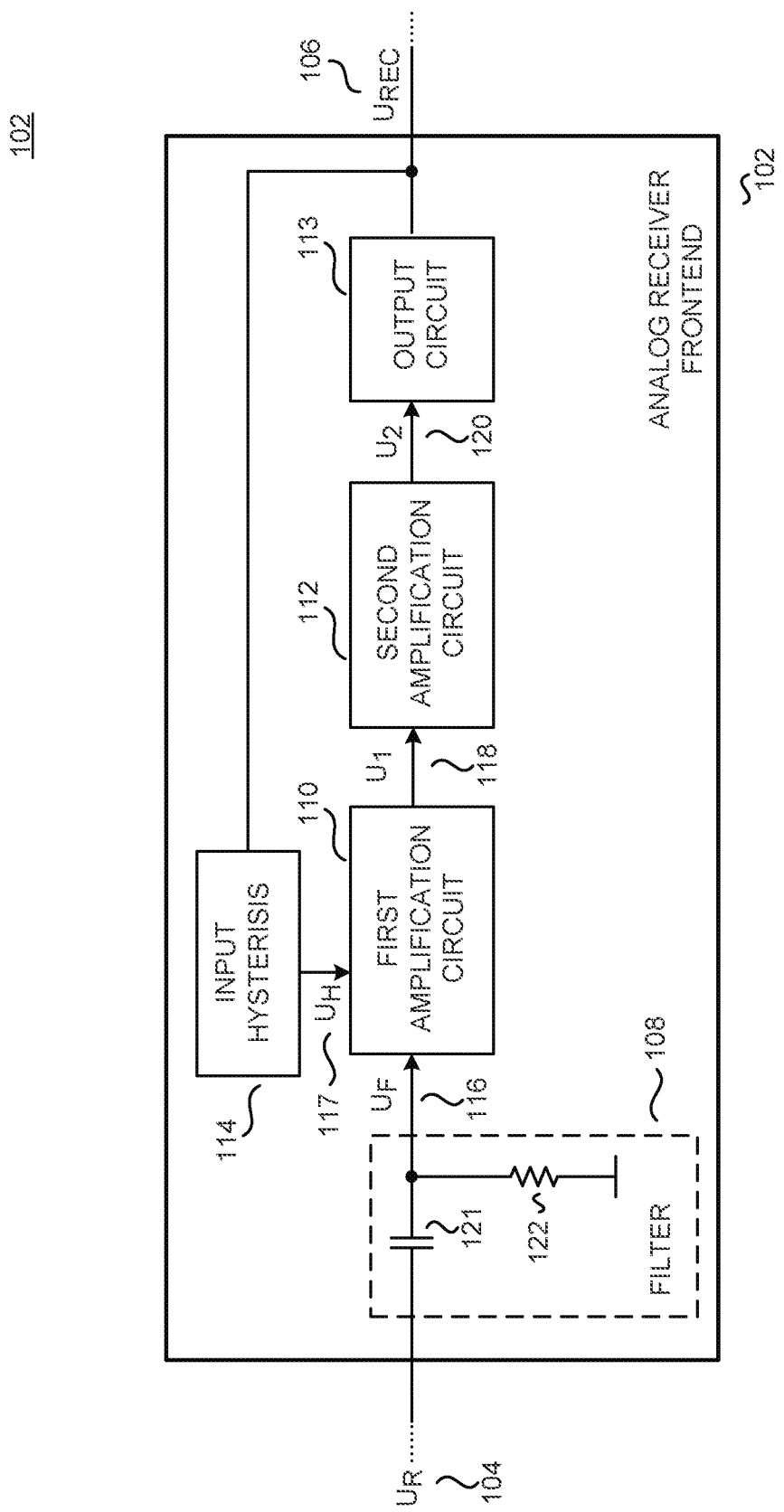
FIG. 1 illustrates an example block diagram of a analog receiver frontend which includes amplifiers and an input hysteresis block, in accordance with teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, communication systems may use inductive coupling to send information between a transmitter and a receiver. A signal may sent to a receiver by varying the current flowing through a transmitting conductor. The varying current induces a voltage across the ends of a receiving conductor. In some cases, the signal sent by the transmitter may be an approximation of a rectangular pulse waveform. The received voltage may resemble a sinusoidal waveform that can be characterized by how quickly the received voltage oscillates (generally referred to as the "frequency") and the size of the oscillations (generally referred to the "amplitude"). In some cases, the receiver may identify the transmission of pulses by comparing the received voltage to a threshold voltage. However, for weak inductive coupling, the amplitude swing of the received voltage may be relatively small. The threshold voltage may be near the reference to aid in the detection of received signals. However, a receiver with a low threshold voltage may be sensitive to noise and the receiver may misinterpret the noise as a transmitted signal. Further, the frequency of the received signal may be relatively high. Circuitry within the receiver thus must be fast enough to operate at the frequency of the received signal. In addition, the circuitry should have low current consumption since the receive circuit should be active most of the time in order to transduce the short induced voltages.

In some cases of the present invention, an analog receiver frontend may include a first and second amplification circuit, and an input hysteresis circuit. The analog receiver frontend may also include a high pass filter which filters the received signal and outputs a filtered signal to the first amplification stage. The first amplification circuit may amplify the difference between the filtered signal and a threshold. A pulse may be detected when the filtered signal reaches the threshold. The duration of the detected pulse may be taken to be the time required for the filtered signal to again cross the threshold in the other direction. In some cases, the input hysteresis circuit may respond to an initial threshold crossing due to a pulse by level shifting either the filtered signal or the threshold such that the time required for the filtered signal to again cross the threshold in the other direction increases. As such, the duration of the detected pulse appears to have increased, making it easier for other circuitry to process the received signal. In some cases, the second amplification circuit may include a current mirror. The second amplification circuit can respond to the apparently longer-duration pulses ouput from the first amplification circuit. The second amplification circuit may limit the voltage of the output of the first amplification stage. If the first amplification stage were to have a large output voltage, then the net capacitances at the output of the first amplification stage would require more time to charge and discharge. In contrast, a second amplification stage that limits the voltage of the output of the first amplification stage may improve the speed of the first amplification stage by limiting the output voltage swing.

Such an analog receiver frontend may be particularly advantageous in the context of noisy environments, such as in controllers for power switches where different portions of the controller are galvanically isolated from one another. In particular, the power switched by a power switch can be much larger than the power of a signal transmitted across an inductive coupling. For example, a power switch may switch 100's or even 1000's of volts whereas the transmitted signals may be 100's of mV or less. An analog receiver frontend that is able to resolve the signals transmitted across an inductive coupling is thus important.

Further, the proposed analog receiver frontend can be implemented using rather slow technology (with long/slow transistors). Such relatively slow technology may be advantageous for other circuit elements due to an accompanying high voltage capability.

An analog receiver frontend that includes both a first and second amplification circuit in which the second circuit is a current mirror allows the first amplification circuit to respond to high frequency signals, such as pulses having durations of 10 nS or less, e.g., 5 nS or less. Through appropriate filtering, such pulses can be distinguished from even the noise resulting from the power switch switching much larger voltages. In particular, the receive loop of an inductive coupling may be coupled to a filter that removes lower frequency components received by the receive loop. Even after lower frequency components are removed, a receiver threshold for detecting transmitted pulses cannot be set too low since the noise on the receive loop may cross the too-low threshold. However, a higher threshold, namely one which allows the receiver to respond more selectively or even exclusively to transmitted signals, will cause the receiver to respond only to a relatively small portion of the signal. In other words, if a signal on the receive loop resembles a sinusoidal signal, the apparent duration of the signal decreases as the detection threshold is increased from close to zero voltage (i.e., at the local minima of the signal) through an intermediate voltage (i.e., at the slope inflection of an ideal sine wave) to the maximum voltage of the received signal. Finally, if the detection threshold exceeds the local maximum value in the amplitude of the oscillations, then the apparent duration of the signal on the receive loop disappears entirely.

Even if the apparent duration does not disappear altogether, as a practical matter, it is preferred that the apparent duration of the signal on the receive loop remain large enough for subsequent processing by downstream circuitry. For example, in some cases, downstream digital circuitry may operate best with pulses having an apparent duration around within 25% of a 50% duty cycle of the pulse frequency, e.g., within 10% of a 50% duty cycle of the pulse frequency. For pulses having durations of 10 nS or less, e.g., 5 nS or less, this would mean that the pulses would have an apparent duration of between 1.5 and 3.5 ns.

These and other issues can be addressed by using hysteresis as described below. The hysteresis can be set such that—in response to an initial recognition of a pulse—the time that the received pulse remains above or below the threshold is extended. For example, an initial threshold of between 50 and 200 mV can be set for the detection of a pulse. That threshold can be reduced or increased (or the signal level increased or reduced) by 20-80 mV to extend the apparent duration of the pulse. Despite the variation to the threshold or the signal level, the noise sensitivity is not increased.

Figure 2:
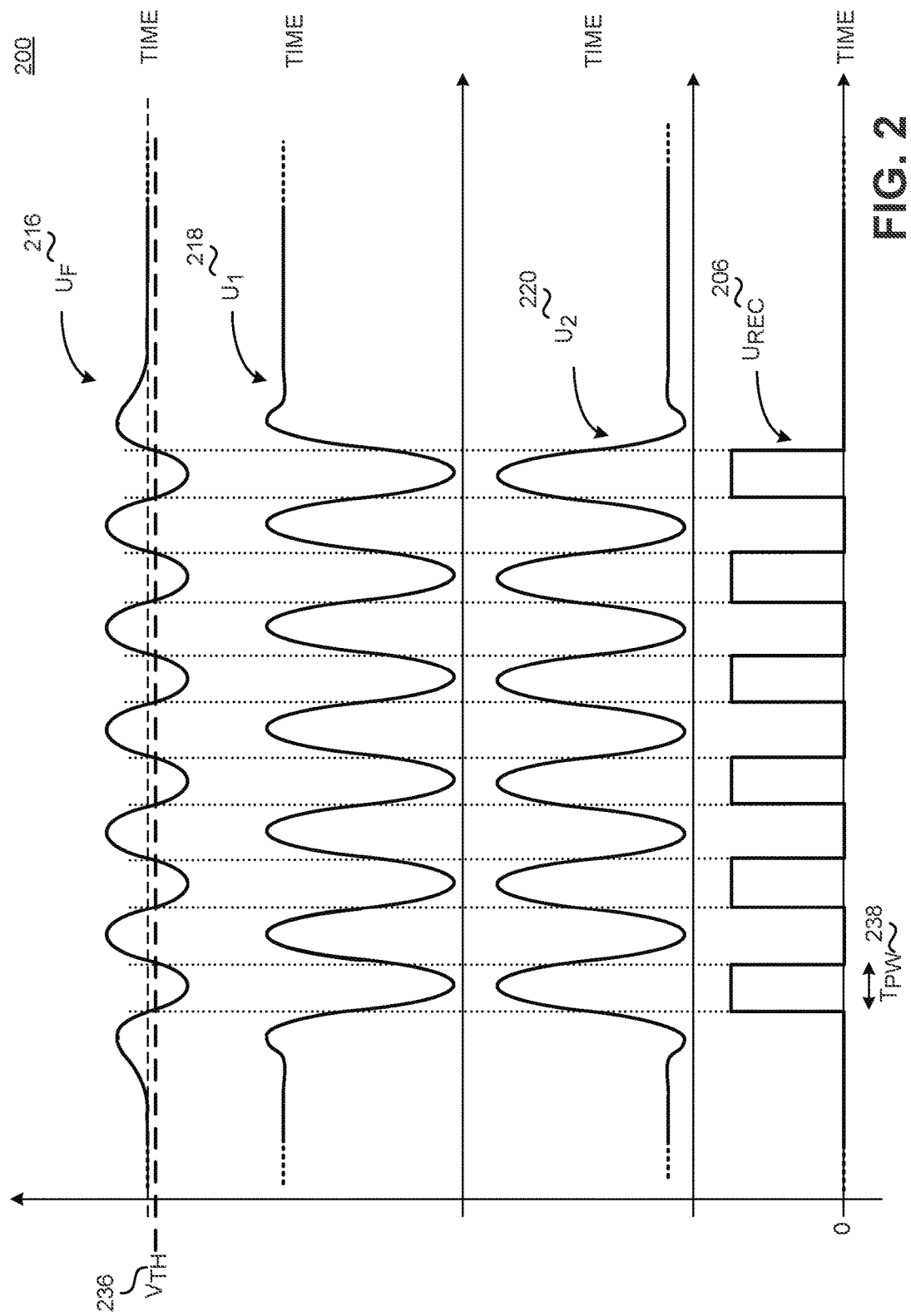
FIG. 2 is a timing diagram illustrating example waveforms of the filtered signal, first signal, second signal, and recovered signal of FIG. 1, in accordance with the teachings of the present invention.

Referring first to FIG. 1, a analog receiver frontend 102 includes a filter 108, a first amplification circuit 110, a second amplification circuit 112, an output circuit 113, and an input hysteresis circuit 114. Further illustrated in FIG. 2 are the received signal $U_R$ 104, filtered signal $U_F$ 116, first signal $U_1$ 118, second signal $U_2$ 120, and a hysteresis signal $U_H$ 117. In some cases, the received signal $U_R$ 104 may be the induced voltage or current due to the receipt of a signal that has been communicated via magnetically coupled conductors.

Filter 108 is coupled to filter relatively lower frequency components from the received signal $U_R$ 104. In the illustrated analog receiver frontend 102, filter 108 is shown as a high pass filter that includes a capacitance 121 and resistance 122. Filter 108 outputs the filtered signal $U_F$ 116 to the first amplification circuit 110. The first amplification circuit 110 amplifies the difference between the filtered signal $U_F$ 116 and a threshold and outputs the resultant difference as first signal $U_1$ 118. The first amplification circuit 110 is also coupled to receive hysteresis signal $U_H$ 117 from the input hysteresis circuit 114. As will be further discussed, the hysteresis signal $U_H$ 117 may level shift either or both of the filtered signal $U_F$ 116 and the threshold of the first amplification circuit 110 in response to the recovered signal $U_{REC}$ 106.

The second amplification circuit 112 is coupled to receive the first signal $U_1$ 118. In operation, the second amplification circuit 112 amplifies and inverts the first signal $U_1$ 118 and outputs the result as second signal $U_2$ 120. In some cases, the second amplification circuit 112 may include a current mirror. The amount of amplification may be influenced by the ratio between the transistors included in the current mirror. The use of a current mirror in second amplification circuit 112 allows a defined threshold to be set in the first amplification circuit 110 even in the case that the output resistance of the first amplification circuit 110 (Q1 324 shown in FIG. 3) is not very high. Amplification of pulses in first signal $U_1$ 118 may thus be improved by such pulses having a longer duration in $U_1$ 118 than in filtered signal $U_F$ 116, as discussed further below. The second amplification circuit 112 (shown as a current mirror in further examples) may also reduce the rise and fall time of the first signal $U_1$ 118 due to limiting the output voltage swing of the first amplification circuit 110 and the net capacitance of all connected circuitry at the terminal between the first amplification circuit 110 and the second amplification circuit 112. The output circuit 113 is coupled to receive the second signal $U_2$ 120 and outputs the recovered signal $U_{REC}$ 106. The second signal $U_2$ 120 may resemble a substantially sinusoidal analog signal. Output circuit 113 converts the analog signal into a rectangular pulse waveform with varying durations of high and low sections. In some cases, output circuit 113 may include two inverters which invert the second signal $U_2$ 120 twice and output a digital waveform. As such, the recovered signal $U_{REC}$ 106 may be a rectangular pulse waveform of high and low sections of varying durations. In some cases, the first inverter (shown as inverter 331 in FIG. 3) may be implemented with a current mode input.

In operation, the recovered signal $U_{REC}$ 106 can transition from a low to a high value in response to the filtered signal $U_F$ 116 crossing the threshold of the first amplification circuit 110 and transitions from a high to low value in response to the filtered signal $U_F$ 116 subsequently crossing the (potentially level-shifted) threshold in the other direction. In other words, the recover circuit 102 initially detects a received pulse when the filtered signal $U_F$ 116 crosses the threshold of the first amplification circuit 110 and detects the end of the received pulse when the filtered signal $U_F$ 116 next crosses the (potentially level-shifted) threshold of the first amplification circuit 110.

The input hysteresis circuit 114 can be coupled to increase the apparent duration of the received pulse. With the states as illustrated herein, this will increase the time that recovered signal $U_{REC}$ 106 is high. In some cases, the input hysteresis circuit 114 may commence level shifting of the filtered signal $U_F$ 116 in response to the initial detection of a pulse (i.e., detection of the leading edge of the recovered signal $U_{REC}$ 106). The level shift may increase the time required for the level shifted filtered signal $U_F$ 116 to again cross the threshold, albeit in the other direction. In other words, the level shift may increase the difference between the filtered signal $U_F$ 116 and the threshold. With the illustrated logic, the recovered signal $U_{REC}$ 106 returns to a low value when the level shifted filtered signal $U_F$ 116 next crosses the threshold of the first amplification circuit 110. The apparent duration of the high value of the recovered signal $U_{REC}$ 106 is increased relative to the duration were the filtered signal $U_F$ 116 not level-shifted. In other cases, the input hysteresis circuit 114 may level shift the threshold of the first amplification stage in response to initial detection of the pulse (e.g., detection of the leading edge of the recovered signal $U_{REC}$ 106). Such a level shift can also increase the time required for the filtered signal $U_F$ 116 to cross the threshold of the first amplification stage 110 in the other direction. For example, the threshold may be level shifted to increase the difference between the threshold and the filtered signal $U_F$ 116. As such, the time required for the filtered signal $U_F$ 116 to again cross the level shifted threshold increases and the apparent duration of the detection pulse increases. In some cases, the input hysteresis circuit 114 may level shift both the filtered signal $U_F$ 116 and the threshold of the first amplification stage in response to initial detection of the pulse. Such level shifting may commence simultaneously or at different times.

FIG. 2 is a timing diagram 200 that includes example waveforms of the filtered signal $U_F$ 216, first signal $U_1$ 218, second signal $U_2$ 220, and recovered signal $U_{REC}$ 206. As shown, the first signal $U_1$ 218 is an amplification of the differences between the filtered signal $U_F$ 216 and the threshold $V_{REF}$ 236. The threshold $V_{REF}$ 236 is the threshold of the first amplification circuit discussed with respect to FIG. 1. The second signal $U_2$ 220 may be a further amplification and inversion of the first signal $U_1$ 218. The y-axis scale for first signal $U_1$ 218 and second signal $U_2$ 220 may differ. As shown, the filtered signal $U_F$ 216, first signal $U_1$ 218, and second signal $U_2$ 220 generally resemble sinusoidal waveforms. However, it should be appreciated that the waveforms of the signals may resemble other shapes. The output circuit of FIG. 1 receives second signal $U_2$ 220 and outputs a substantially rectangular signal $U_REC$ 206. The signal $U_REC$ 206 transitions from a high to low value and vice versa when the filtered signal $U_F$ 216 crosses the threshold $V_{REF}$ 236. In particular, the recovered signal $U_{REC}$ 206 transitions from a low to high value when the filtered signal $U_F$ 216 falls below the threshold $V_{REF}$ 236. The recovered signal $U_{REC}$ 206 transitions from a high to low value when the filtered signal $U_F$ 216 crosses the threshold $V_{REF}$ 236 again in the other direction. As discussed previously, either or both of filtered signal $U_F$ 216 and threshold $V_{REF}$ 236 may be level shifted at different times. The duration during which the recovered signal $U_{REC}$ 206 is high may be referred to as the apparent recovered pulse width $T_{PW}$ 238. The duration of the apparent recovered pulse width $T_{PW}$ 238 is increased by applying a level shift to either or both of filtered signal $U_F$ 216 and threshold $V_{REF}$ 236.

Figure 3A:
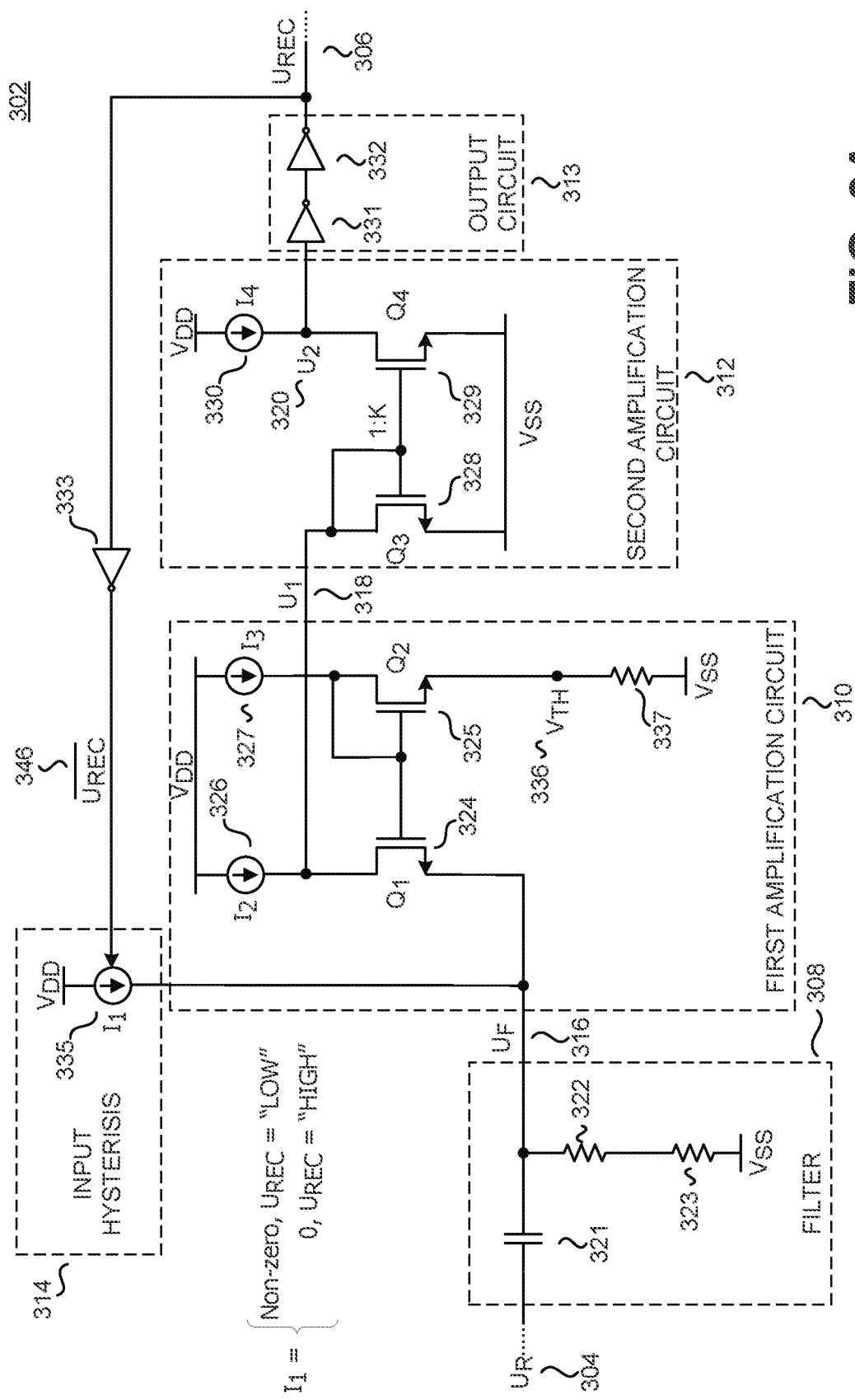
FIG. 3A is a schemating diagram illustrating an example analog receiver frontend of FIG. 1, in accordance with the teachings of the present invention.

FIG. 3A illustrates an analog receiver frontend 302 that is one example of the analog receiver frontend 102 discussed above. Analog receiver frontend 302 includes a filter 308, a first amplification circuit 310, a second amplification circuit 312, an output circuit 313, and an input hysteresis circuit 314.

Filter 308 includes capacitance 321 and resistances 322, 323 coupled together as a high pass filter. Filter 308 receives and filters the received signal $U_R$ 304 and outputs filtered signal $U_F$ 316. The filtered signal $U_F$ 316 is dropped across the resistances 322, 323. Not shown in FIG. 3A is an optional capacitance (such as capacitance 550, FIG. 5) prior to the filter 308. One end of the optional capacitance may be coupled to the received signal $U_R$ 304 and the other end is coupled to $V_{SS}$. The optional capacitance to improve noise immunity may also be inherently provided by the parasitic output capacitance of a transmitter or other component coupled to the input of the analog receiver frontend 302.

The first amplification circuit 310 includes transistors Q1 324, Q2 325, a current source 326 that outputs a current $I_2$, current source 327 that outputs a current $I_3$, and resistance 337 coupled together as a common-gate differential amplifier. The source of transistor Q2 325 is coupled to resistance 337. The voltage at the node between the resistance 337 and source of transistor Q2 325 is the threshold $V_{TH}$ 336 discussed above with respect to FIGS. 1 and 2. The source of transistor Q1 324 is coupled to receive the filtered voltage $U_F$ 316. The output (first signal $U_1$ 318) of the first amplification circuit 310 is the current $I_2$ of current source 326 minus the drain current of transistor Q1 324. The first amplification circuit 310 amplifies the difference between the filtered signal $U_F$ 316 and the threshold $V_{TH}$ 336. As shown, the threshold $V_{TH}$ 336 is greater than reference $V_{SS}$. In some cases, the effective threshold respective to the received signal $U_R$ 304 may be a negative value and is given by the threshold $V_{TH}$ 336 minus the voltage $U_F$ 316 under DC conditions. The analog receiver frontend 302 may thus identify pulses from the negative swings of the received signal $U_R$ 304. In some cases, the size and transconductance of the transistors Q1 324, Q2 and 325 may be relatively low but large enough to provide sufficient matching.

Second amplification circuit 312 includes transistors Q3 328, Q4 329, and current source 330 with current $I_4$ coupled together as a current mirror. The drain source current of transistor Q4 329 is an amplified version of the drain source current of transistor Q3 328. The amount of amplification is determined by the ratio (1:N) of the sizes of transistors Q3 328 and Q4 329. In some cases, the current through transistor Q4 329 may be be twice the current through transistor Q3 328. In addition, the second amplification circuit 312 inverts the first signal $U_1$ 318. The output (second signal $U_2$ 320) of the second amplification circuit 312 is the drain voltage of transistor Q4 329. In some cases, the current $I_4$ of current source 326 is substantially equal to the current $I_2$ of current source 330 when the current mirror ratio of the second amplification stage 312 is substantially two. As such, the second signal $U_2$ 320 switches when the filtered signal $U_F$ 316 crosses the threshold $V_{TH}$ 336. In addition, the current $I_2$ of current source 330 may be double the current $I_3$ of current source 327. The use of a current mirror in second amplification circuit 312 allows a defined threshold to be set in the first amplification circuit 310. The amplification of pulses in first signal $U_1$ 318 may be improved since such pulses appear to have a longer pulse-width duration due to the level shifting. The current mirror may also reduce the rise and fall time of the first signal $U_1$ 318 since transistor Q3 328 limits the voltage swing of U1 318. In addition, the input impendence of the second amplification circuit 312 (and, in particular, the input impedence of the transistor Q3 328) should be set higher than zero such that the output voltage level (first signal $U_1$ 318) of the first amplification stage is within the operating range. Further, the operation of the second amplification circuit 312 is set such that the transistors of the first amplification circuit 310 operate in the saturation region.

Output circuit 313 includes inverters 331, 332 and is coupled to receive the second signal $U_2$ 220 and output the recovered signal $U_{REC}$ 306. The output circuit 313 may invert the second signal $U_2$ 120 twice to output a generally rectangular pulse waveform. As such, the recovered signal $U_{REC}$ 306 may be a generally rectangular pulse waveform with high and low sections of varying duration.

Inverter 333 is coupled between the output circuit 313 and the input hysteresis 314 and inverts the recovered signal $U_{REC}$ 306. However, the voltage between inverters 331 and 332 may also be received by the input hysteresis circuit 314. Input hysteresis circuit 314 includes a controlled current source 335. The controlled current source 335 is controlled by the output of the inverter 333 (inverted recovered signal 346), e.g., by the recovered signal $U_{REC}$ 306. The current provided by the controlled current source 335 may be one example of hysteresis signal discussed above. For the illustrated logic, the value of the current $I_1$ output from the controlled current source 335 is substantially zero when the inverted recovered signal 346 is low (i.e. the recovered signal $U_{REC}$ 306 is high) and substantially non-zero when the inverted recovered signal 346 is high (i.e. the recovered signal $U_{REC}$ 306 is low). In some cases, the input hysteresis 314 may receive both the recovered signal $U_{REC}$ 306 and the inverted recovered signal 346 to control how much current the input hysteresis 314 provides.

In operation, input hysteresis circuit 314 provides a non-zero current $I_1$ that increases the difference between the filtered signal $U_F$ 316 and a reference voltage $V_{SS}$. In the illustrated implementation, in response to detection of filtered signal $U_F$ 316 falling below the threshold $V_{TH}$ 336, recovered signal $U_{REC}$ 306 transitions to a high value. A high recovered signal $U_{REC}$ 306 in turn triggers input hysteresis circuit 314 to reduce the output current $I_1$ (e.g., so that the current $I_1$ is substantially zero) and level shift the filtered signal $U_F$ 316 downward further below threshold $V_{TH}$ 336. The duration of the high state in recovered signal $U_{REC}$ 306 corresponds to the time between the level-shifted signal $U_F$ 316 falling below the threshold $V_{TH}$ 336 and subsequently rising above threshold $V_{TH}$ 336. With hysteresis circuit 314 driving filtered signal $U_F$ 316 more negative, the duration of the high state in recovered signal $U_{REC}$ 306 is extended.

In response to the recovered signal $U_{REC}$ 306 transitioning to a low value, the input hysteresis circuit 314 increases current $I_1$ (e.g., current $I_1$ is set to a non-zero value) and filtered signal $U_F$ 316 is level shifted upward. With the non-zero current $I_1$, filtered signal $U_F$ 316 rises with respect to $V_{SS}$.

Figure 3B:
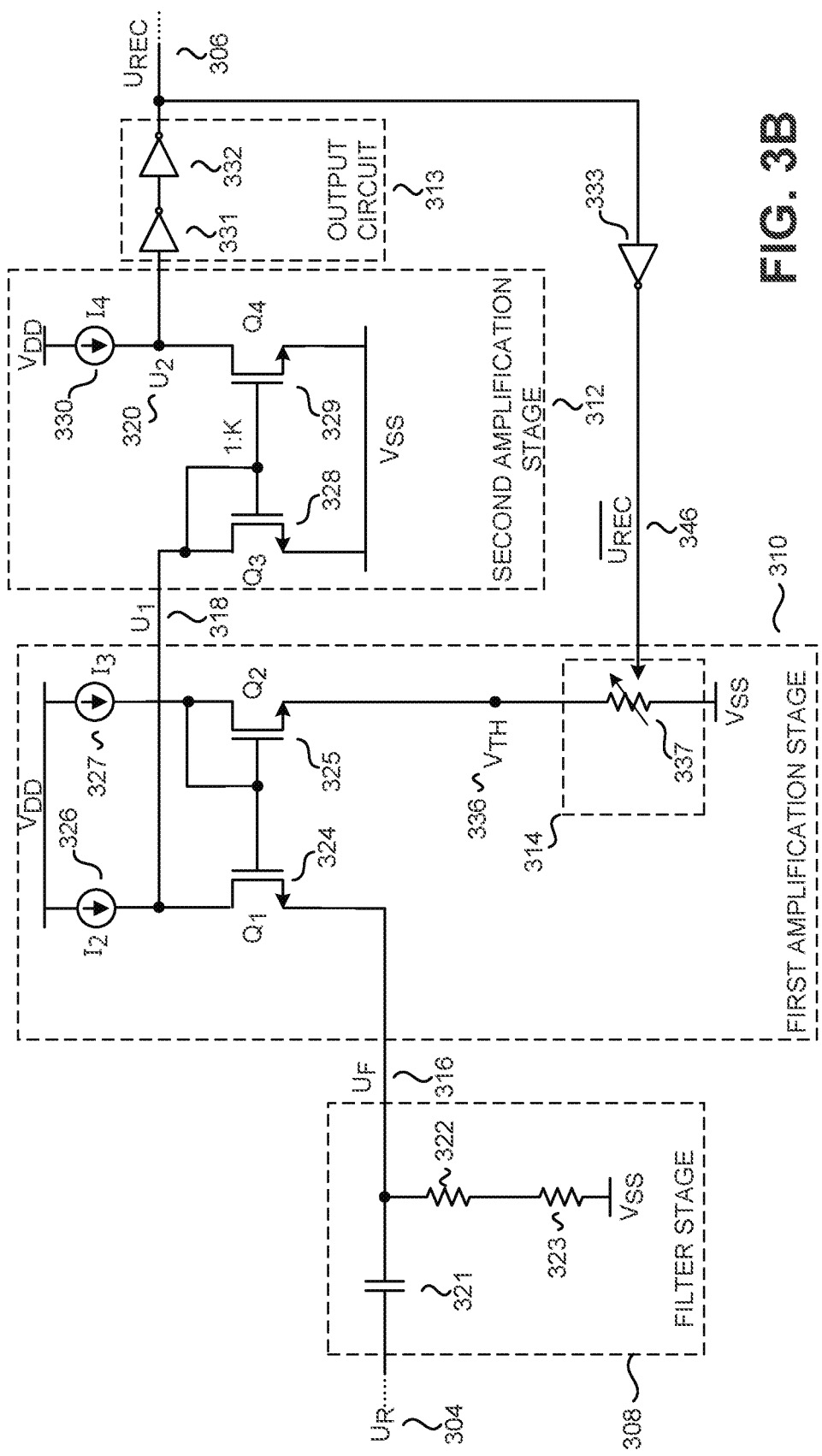
FIG. 3B is a schemating diagram illustrating an example analog receiver frontend of FIG. 1, in accordance with the teachings of the present invention.

FIG. 3B illustrates an analog receiver frontend 303 that is another example of the analog receiver frontend 102 discussed above. The analog receiver frontend 303 includes a filter 308, first amplification circuit 310, second amplification circuit 312, output circuit 313, and input hysteresis circuit 314. The analog receiver frontend 303 may also include an optional capacitance (not shown) for improved noise immunity. The analog receiver frontend 303 illustrated in FIG. 3B differs from the analog receiver frontend 302 shown in FIG. 3A in that input hysteresis circuit 314 includes a variable resistance 337 that sets voltage threshold $V_{TH}$ 336. As illustrated, the resistance of variable resistance 337 (and the magnitude of threshold $V_{TH}$ 336) are controlled by the inverted recovered signal 346.

In operation, variable resistance 337 may be set initially such that the threshold $V_{TH}$ 336 is substantially equal to a first value. A pulse is detected when the filtered signal $U_F$ 316 falls below the threshold $V_{TH}$ 336. In response, the recovered signal $U_{REC}$ 306 transitions to a high value. A high recovered signal $U_{REC}$ 306 in turn triggers input hysteresis circuit 314 to increase the resistance of variable resistance 337 to increase threshold $V_{TH}$ 336 and move it further away from reference voltage $V_{SS}$. When the filtered signal $U_F$ 316 is less than the threshold $V_{TH}$ 336, an increase in the value of the threshold $V_{TH}$ 336 increases the absolute value of the difference between the filtered signal $U_F$ 316 and the threshold $V_{TH}$ 336. The duration of the high state in recovered signal $U_{REC}$ 306 corresponds to the time between the filtered signal $U_F$ 316 falling below the threshold $V_{TH}$ 336 and subsequently rising above the elevated threshold $V_{TH}$ 336. With hysteresis circuit 314 increasing threshold $V_{TH}$ 336, the duration of the high state in recovered signal $U_{REC}$ 306 is extended. In response to the recovered signal $U_{REC}$ 306 transitioning to a low value, the input hysteresis circuit 314 again level shifts the threshold $V_{TH}$ 336 by decreasing the resistance of the variable resistance 337. In general, the threshold $V_{TH}$ 336 will return to the initially-set first value.

Figure 4A:
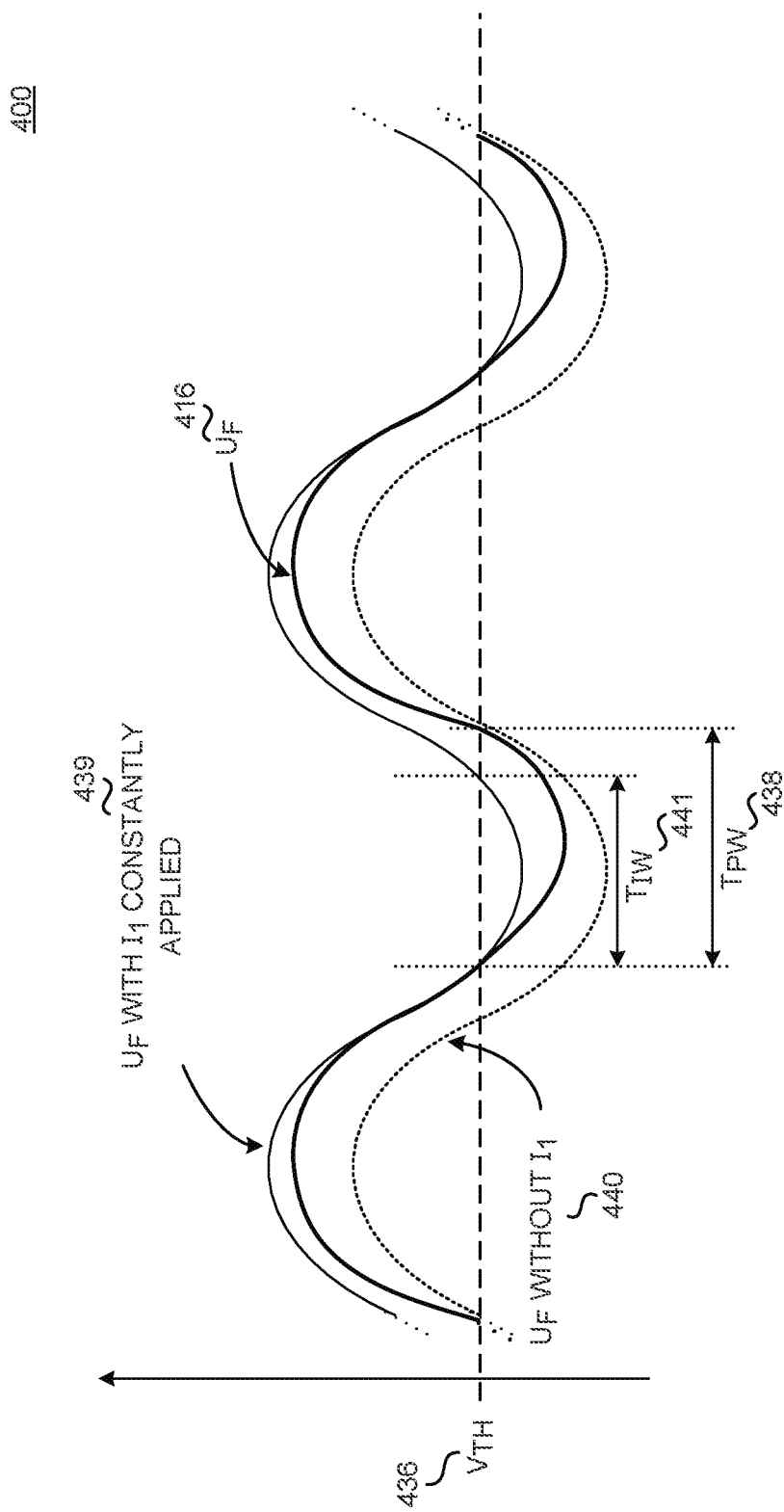
FIG. 4A is a timing diagram illustrating an example waveform of the filtered signal of the analog receiver frontend of FIG. 3A, in accordance with the teachings of the present invention.

FIG. 4A is a timing diagram 400 which illustrates filtered signal $U_F$ 416 of the analog receiver frontend of FIG. 3A (shown as the thicker solid line). For the sake of clarity, the time scale in FIG. 4A is expanded relative to the time scale in FIG. 2. This allows FIG. 4A to illustrate the effect of the input hysteresis circuit 314 illustrated in FIG. 3A and the current $I_1$ on the filtered signal $U_F$ 416 when input hysteresis circuit 314 provides a non-zero current that to level shift the filtered signal $U_F$ 316 to more negative values. In FIG. 4A, the thin solid line 439 represents the filtered signal with the current $I_1$ whereas the dotted line 440 illustrates the filtered signal without the current $I_1$.

In response to the filtered signal $U_F$ 416 falling below the threshold $V_{TH}$ 436, current I1 is not applied and the filtered signal $U_F$ 416 is level shifted downward. The absolute value of the difference between this level shifted filtered signal $U_F$ 416 and the threshold $V_{TH}$ 436 is greater than the absolute value of the difference between the filtered signal 439 with the application of current $I_1$ and the threshold $V_{TH}$ 436. Filtered signal $U_F$ 416 gradually transitions to the dotted line 440 as the capacitance in the filter stage charges. Once the downward-shifted filtered signal $U_F$ 416 rises above the threshold $V_{TH}$ 436, the current $I_1$ is again applied and filtered signal $U_F$ 416 gradually transitions to the thin solid line 439. The sizing of the input filter 308 may be selected such that the time constant is in the order of the pulse width.

As illustrated, the duration of the detected pulse is the amount of time that the filtered signal $U_F$ 416 is less than the threshold $V_{TH}$ 436. Without the input hysteresis circuit, the detected pulse width would be substantially $T_{IW}$ 441. However, with the input hysteresis circuit, the detected pulse width is substantially $T_{PW}$ 438. As shown, the duration of pulse width $T_{IW}$ 441 is shorter than the duration of pulse width $T_{PW}$ 438. As such, the analog receiver frontend may recover a longer pulse width.

FIG. 4B is a timing diagram 401 which illustrates the filtered signal $U_F$ 416 and the threshold $V_{TH}$ 436 of the analog receiver frontend of FIG. 3B.

In response to filtered signal $U_F$ 416 falling below the threshold $V_{TH}$ 436, the threshold $V_{TH}$ 436 is level shifted to the value 443. In response to filtered signal $U_F$ 416 rising above the threshold $V_{TH}$ at value 443, the value of the threshold $V_{TH}$ 436 is returned to the value 442. The duration of the detected pulse is the time which the filtered signal $U_F$ 416 is less than the threshold $V_{TH}$ 436. Without the input hysteresis circuit, the detected pulse width would be substantially $T_{IW}$ 441. However, with the input hysteresis circuit, the detected pulse width is substantially $T_{PW}$ 438. As shown, the duration of pulse width $T_{IW}$ 441 is shorter than the duration of pulse width $T_{PW}$ 438. Level shifting the threshold $V_{TH}$ 436 thus extends the detected pulse width without additional parasitics on the signal path and without an additional current source.

Figure 5A:
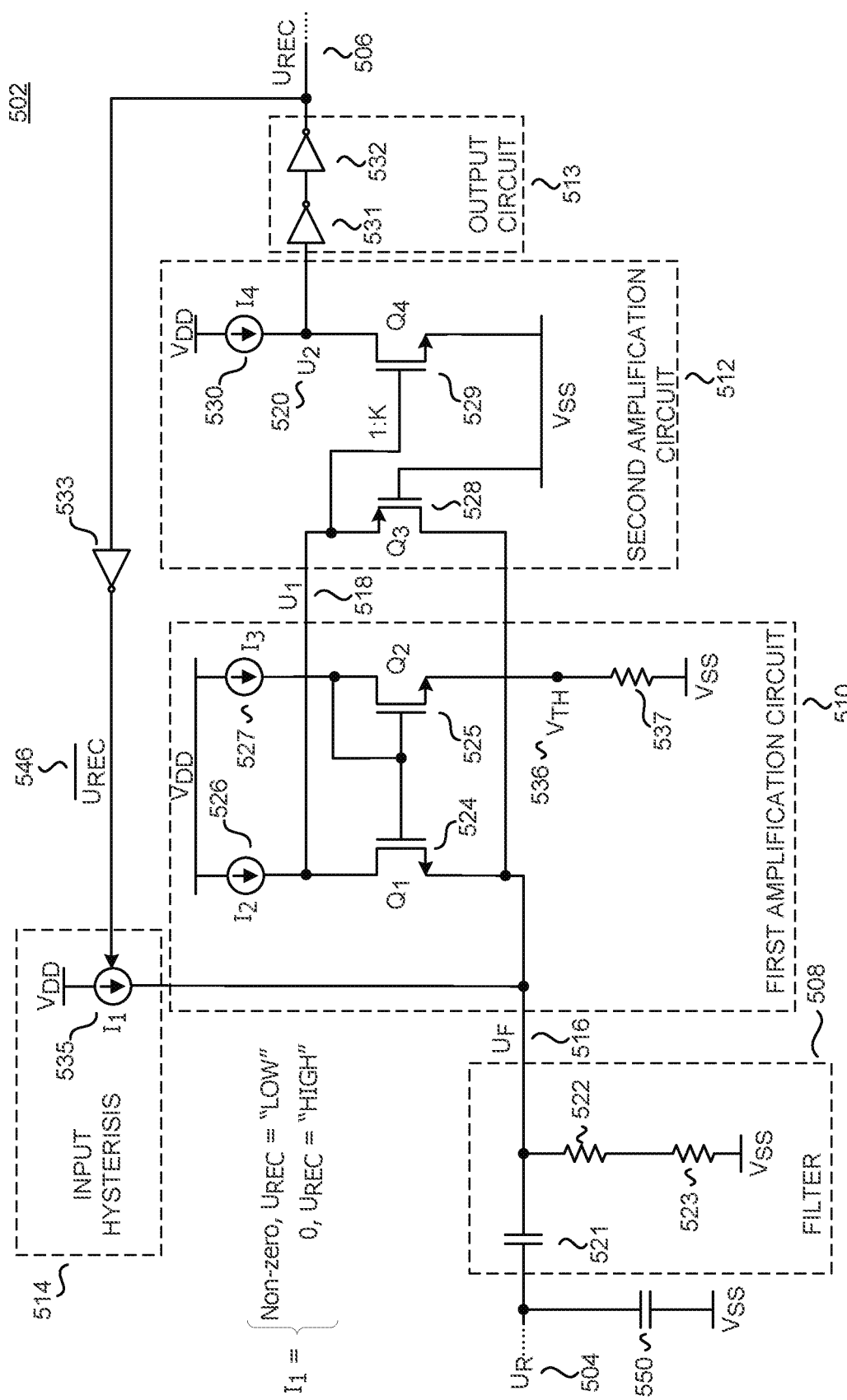
FIG. 5A is a schemating diagram illustrating an example analog receiver frontend of FIG. 1, in accordance with the teachings of the present invention.

FIG. 5A illustrates a analog receiver frontend 502 that is another example of the analog receiver frontend 102 discussed above. The analog receiver frontend 502 includes a filter 508, first amplification circuit 510, second amplification circuit 512, output circuit 513, and input hysteresis circuit 514. The analog receiver frontend 502 illustrated in FIG. 5A differs from the analog receiver frontend 302 shown in FIG. 3A in that the second amplification circuit 512 includes transistors Q3 528, Q4 529, and current source 530 coupled together as a current controlled current source. In particular, the transistors Q3 528, Q4 529, and current source 530 are coupled together as a nonlinear current mirror or a four-terminal current mode amplifier. As illustrated, transistor Q3 528 may be a PMOS transistor and is coupled across transistor Q1 524. In other words, the drain of transistor Q3 528 is coupled to the source of transistor Q1 524 while the source of transistor Q3 528 is coupled to the drain of transistor Q1 524. Further, the drain of transistor Q3 528 is coupled to the filtered signal $U_F$ 516. The first signal U1 518 is received at the source of transistor Q3 528 and the gate of Q4 529. Further, the gate of transistor Q3 528 is coupled to reference $V_{SS}$. Further, the operation of the second amplification circuit 512 is set such that the transistors of the first amplification circuit 510 operate in the saturation region. Further illustrated in FIG. 5A is optional capacitance 550 which may be used to improve noise immunity. The optional capacitance to improve noise immunity may also be provided by the parasitic output capacitance of a transmitter or other component coupled to the input of the analog receiver frontend.

In operation, the second amplification stage amplifies the input current to the second amplification stage 512 and is output by the drain of transistor Q4 529. As such, the output of the second amplification stage 512 is the voltage U2 520 as a result of the transistor Q4 529 and the current source I4 530. The drain source current of transistor Q4 529 is an amplified version of the source drain current of the transistor Q3 528, however, the amplification may be nonlinear. However, the net capacitance at a node between the first amplification circuit 510 and the second amplification circuit 512 may be reduced, as compared to the analog receiver frontends illustrated in FIGS. 3A and 3B, and improve the overall speed of the circuit.

Figure 5B:
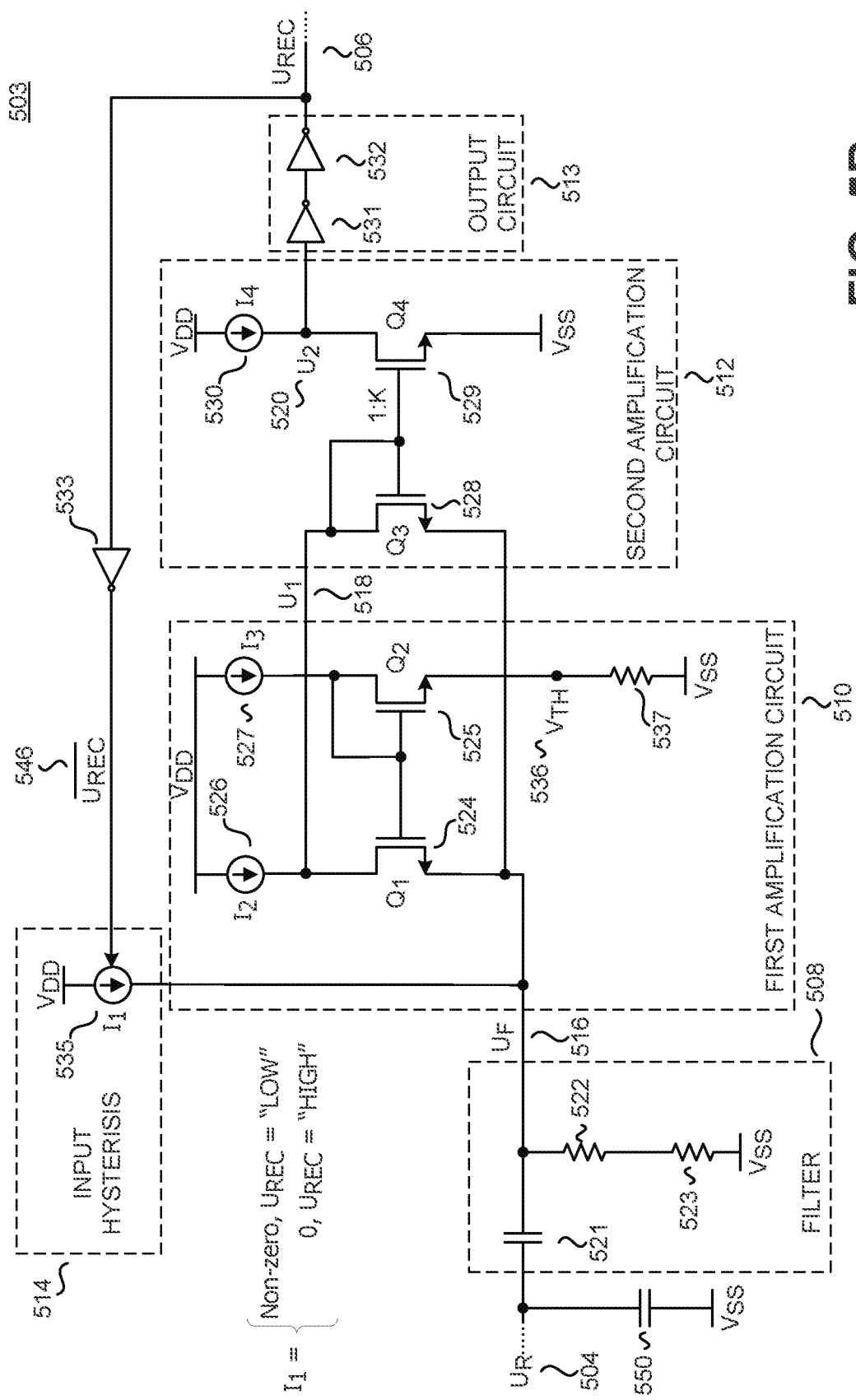
FIG. 5B is schemating diagram illustrating an example analog receiver frontend of FIG. 1, in accordance with the teachings of the present invention.

FIG. 5B illustrates a analog receiver frontend 503 that is another example of the analog receiver frontend 102 discussed above. The analog receiver frontend 503 includes a filter 508, first amplification circuit 510, second amplification circuit 512, output circuit 513, and input hysteresis circuit 514. The analog receiver frontend 503 illustrated in FIG. 5B differs from the analog receiver frontend 302 shown in FIG. 3A in that the second amplification circuit 512 includes transistors Q3 528, Q4 529, and current source 530 coupled together as a current mirror or non-linear current mirror. As illustrated, transistor Q3 528 may be a NMOS transistor and is coupled across transistor Q1 524. In other words, the drain of transistor Q3 528 is coupled to the drain of transistor Q1 524 while the source of transistor Q3 528 is coupled to the source of transistor Q1 524. In other words, the source of Q3 528 may be coupled to the filtered signal $U_F$ 516. Further, the gate of transistor Q3 528 is coupled to its own drain and the gate of transistor Q4 529. The first signal U1 518 is received at the drain and gate of Q3 528 and the gate of Q4 529. Further, the operation of the second amplification circuit 512 is set such that the transistors of the first amplification circuit 510 operate in the saturation region. In one example, the threshold voltage VTH 536 may be substantially equal to reference $V_{SS}$.

Figure 6:
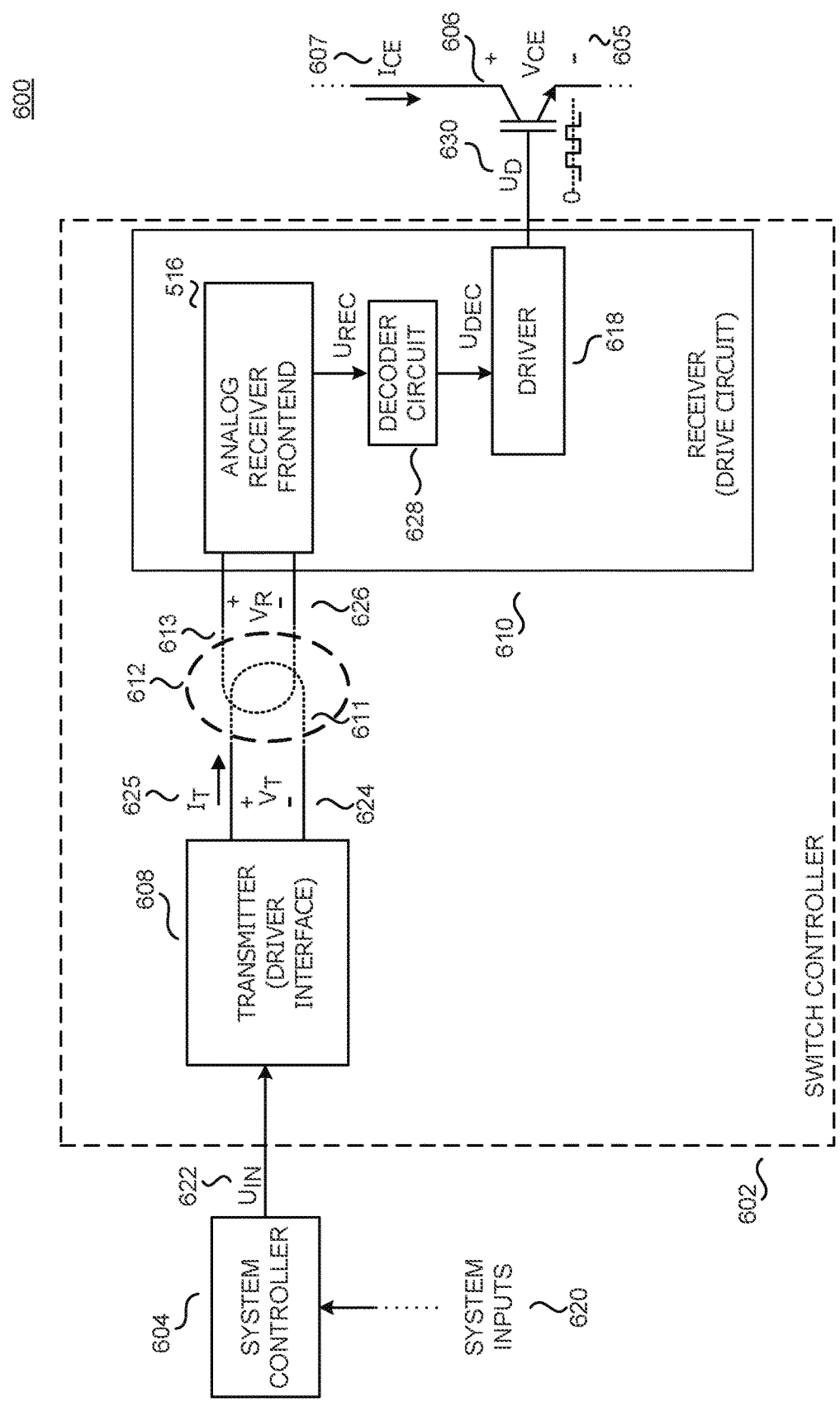
FIG. 6 illustrates one example of a switch controller which may use a communication link to communicate between a transmitter and receiver and the analog receiver frontend, in accordance with the teachings of the present invention.

In operation, the second amplification stage 512 amplifies the input current to the second amplification circuit 512 which is output by the drain of transistor Q4 529. As such, the output of the second amplification stage 512 is the voltage U2 520 as a result of the transistor Q4 529 and the current source I4 530. Further, the entirety of current $I_2$ provided by current source 526 flows through the resistances 522, 523. Therefore, resistances 522 and 523 may be smaller and achieve the same initial difference between the filtered signal $U_F$ 516 and the threshold $V_{TH}$ 536 for the same current $I_2$ 526 as compared to FIGS. 3A and 3B. As a result, the capacitance 521 may be larger which can reduce the influence of the parasitic capacitance of the filtered signal $U_F$ 516. In addition, the gate-source and drain-source capacitances of transistor Q3 528 may have less damping effect on the first signal U1 518 since the filtered signal UF and the first signal U1 518 vary in the same direction. FIG. 6 illustrates a system 600 that includes a switch controller 602 that includes a communication link to communicate between a galvanically isolated transmitter 608 and receiver 610. System 600 also includes an analog receiver frontend 616, a switch controller 602, a system controller 604, and a power switch 606 (illustrated as an IGBT). The switch controller 602 includes a transmitter 608 (also referred to as the driver interface), a receiver 610 (also referred to as the drive circuit) to receive information transmitted across the galvanic isolation, and an inductive coupling 612 that forms the communication link that bridges the galvanic isolation.

Inductive coupling 612 includes a transmit loop 611 and a receive loop 613. Transmit loop 611 may also be referred to as a primary loop/winding. Receive loop 613 may also be referred to as a secondary loop/winding. Loops 611, 613 can be magnetically coupled in a variety of different ways. For example, in some implementations, loops 611, 613 can be wound about a common high-magnetic-permeability core and form a transformer. However, in other implementations, loops 611, 613 need not share a common core. In some implementations, loops 611, 613 can each be single loop inductors formed at least in part by the lead frame of a semiconductor chip package and have relatively small-inductances. As another example, loops 611, 613 can each be inductors formed at least in part by the top metallization layer of a semiconductor chip.

FIG. 6 also illustrates a voltage $V_{CE}$ 605 that is across power switch 606, a current $I_{CE}$ 607 that flows between the main terminals of power switch 606, one or more system inputs 620 that represent information that can be used by system controller 604 to generate a signal that indicates whether power switch 606 should be ON or OFF, input signal $U_{IN}$ 622 that indicates whether power switch 606 should be ON or OFF, transmit voltage $V_T$ 624 that is applied across transmit loop 611 by transmitter 608, transmit current $I_T$ 625 that is conducted through transmit loop 611, receiver voltage $V_R$ 626 that is induced in receiver loop 626 by changes in transmit current $I_R$ 125 (which is also one example of received signal $U_R$), recovered signal $U_{REC}$ which is the transmit signal determined by the analog receiver frontend 616, decoded signal $U_{DEC}$ that is yielded by the decoding of the recovered signal $U_{REC}$ by decoder circuit 628, and drive signal $U_D$ 630 that is output by driver 618 to drive power switch 606.

In operation, system controller 604 is coupled to receive system inputs 620, and determine whether the switch controller 602 should turn ON or turn OFF the power switch 606 based on system inputs 620. System controller 604 also generates an input signal $U_{IN}$ 622 that characterizes the results of that determination.

Transmitter 608 of switch controller 602 is coupled to receive input signal $U_{IN}$ 622. In some cases, the transmitter 608 may be a driver interface. Transmitter 608 encodes input signal $U_{IN}$ 622 for transmission over inductive coupling 612.

Transmitter 608 transmits the transmit voltage $V_T$ 624 to the receiver 610 via the magnetically coupled loops 611, 613 of inductive coupling 612. In some cases, the receiver 610 may be a drive circuit. In the illustrated example, transmitter 608 drives a changing transmitter current $I_T$ 625 through transmit loop 611, which induces voltage $V_R$ 626 in receiver loop 613. As such, the receiver 610 receives information from transmitter 608.

In the illustrated implementation, receiver circuit 610 includes analog receiver frontend 616, decoder circuit 628, and driver 618. Driver 618 outputs the drive signal $U_D$ 630. Drive signal $U_D$ 630 is coupled to be received at the control terminal of power switch 606 to control the switching of the power switch 606. In the illustrated implementation, power switch 606 is an IGBT and drive signal $U_D$ 630 is received at the gate-terminal of the IGBT 606. Analog receiver frontend 616 may be the analog receiver frontend discussed above. The analog receiver frontend 616 receives and determines the transmitted signal from the received signal $V_R$ 626. Decoder circuit 628 is coupled to receive the recovered signal $U_{REC}$ and determine whether the received signal indicates that the power switch 606 should transition from an ON state to an OFF state or vice-versa. Decoder circuit 628 outputs decoded signal $U_{DEC}$ that characterizes the results of this determination.

Figure 7:
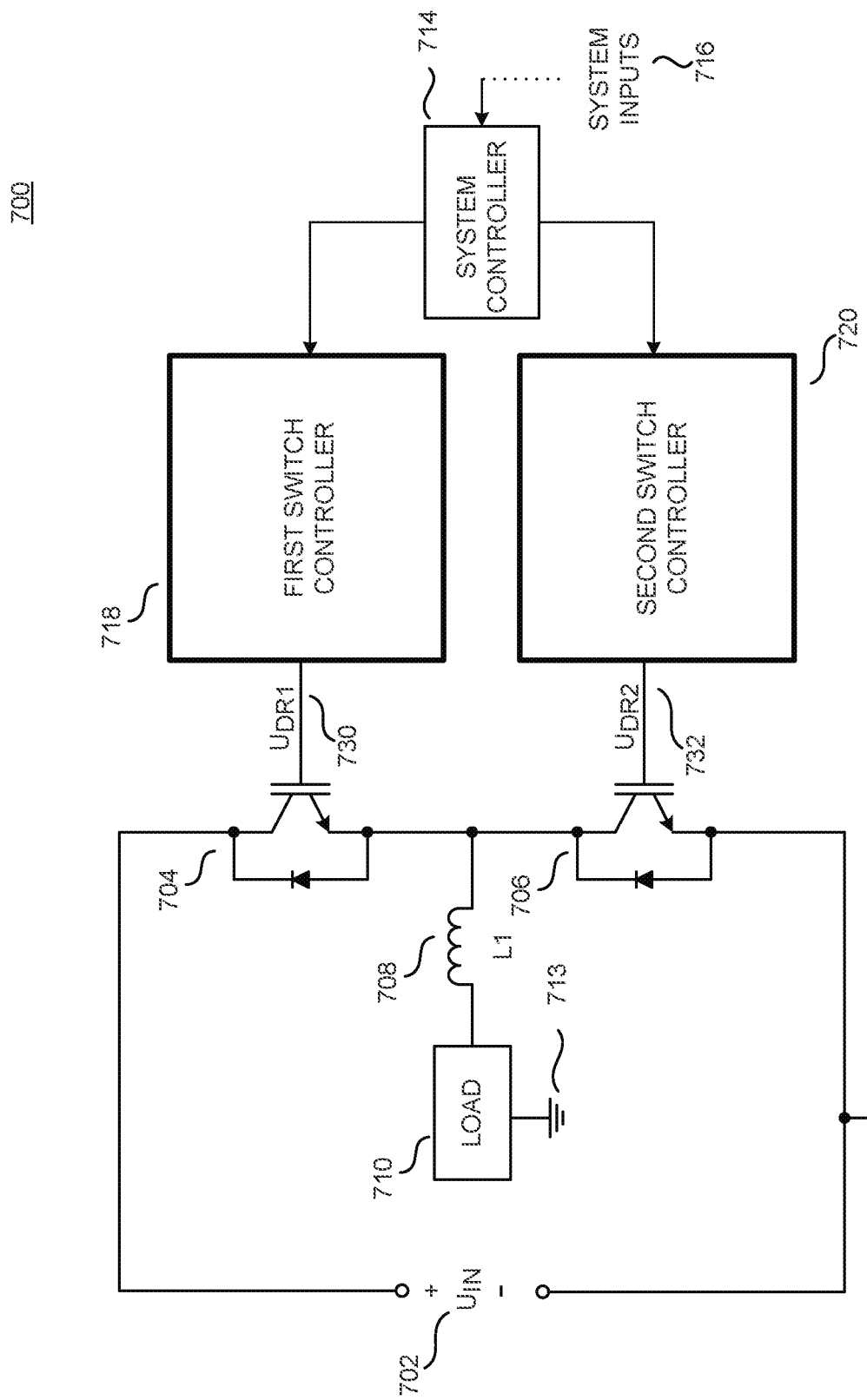
FIG. 7 is example power conversion system utilizing a switch controller which uses a communication link to communicate between a transmitter and a receiver and the analog receiver frontend, in accordance with teachings of the present invention.

FIG. 7 illustrates an example power converter 700 that includes switch controllers that may include analog receiver frontends. Power converter 700 provides electrical energy to a load 710. Power converter 700 includes two power switches 704, 706 coupled in series. In addition, power converter 700 receives an input voltage 702 ($U_{IN}$). Power converter 700 is designed to transfer electrical energy from the input to a load 710 by controlling the switching of power switches 704, 706. In different implementations, the power converter 700 can control voltage, current, or power levels of the energy output to the load.

In the example shown in FIG. 7, the power switches 704, 706 are n-channel IGBTs. However, examples of the present invention can also be used in combination with other power switches. For example, metal-oxide-semiconductor field-effect transistors (MOSFETs), bipolar transistors, injection enhancement gate transistors (IEGTs) and gate turn-off thyristors (GTOs) can be used. In addition, the power converter 700 can be used with power switches that are based on gallium nitride (GaN) semiconductors or silicon carbide (SiC) semiconductors.

Power switches 704, 706 are each controlled by a first and second control circuit 718, 720. The first switch controller 718 and the second switch controller 720 may include the switch controller described above. The first switch controller 718 and the second switch controller 720 provide a first and second gate driver signal 730, 732 ($U_{DR1}$, $U_{DR2}$) which control the switching of the first and second IGBTs 704, 706. The two control circuits 718, 720 can optionally be controlled by a system controller 714. Such a system controller can include an input for receiving system input signals 716. In the example shown in FIG. 7, two power semiconductor switches with a half-bridge configuration are illustrated. However, other topologies can also be used.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the attached claims, it should be understood that the present invention can also (alternatively) be defined in accordance with the following embodiments:

Embodiments

A data communications receiver comprising:
a receiver coil;
a first amplification stage coupled to the receiver coil, the first amplification circuitry to amplify a difference between
  a) at least part of signal received by the receiver coil and
  b) a threshold;
a second amplification stage coupled to receive the amplified difference from the first amplification stage, the second amplification stage comprising a current mirror, and
hysteretic level shifting circuitry to shift a level of
  a) part of the signal received by the receiver coil,
  b) the threshold, or
  c) part of the signal received by the receiver coil and the threshold
such that, in response to the at least part of the signal received by the receiver coil having crossed the threshold, a threshold crossing in the other direction is delayed.

1. The data communications receiver of embodiment 1, wherein the current mirror has an input coupled to receive the amplified difference from the first amplification stage, wherein the current mirror comprises
  a first MOSFET having
    a control terminal,
    a first of the source/drain coupled to the input of the current amplification circuit, and
    a second of the source/drain coupled to a first reference potential, and
  a second MOSFET having
    a control terminal coupled to the input of the current amplification circuit,
    a first of the source/drain coupled to the output of the current amplification circuit, and
    a second of the source/drain coupled to a second reference potential,
wherein, in operation, the control terminal of the first MOSFET is biased so that the first MOSFET remains in a conductive state.

2. A data communications receiver comprising:
a receiver coil;
filter circuitry coupled to filter low frequency components from a signal received by the receiver coil and output a filtered signal;
amplification circuitry coupled to receive the filtered signal and to amplify differences between the filtered signal relative to a threshold; and
hysteretic level shifting circuitry to shift a level of
  a) part of the filtered signal received by the receiver coil,
  b) the threshold, or
  c) both part of the filtered signal and the threshold
such that, in response to the filtered signal having crossed the threshold, a threshold crossing in the other direction is delayed.

3. The data communications receiver of embodiment 3, wherein the amplification circuitry comprises:
a first amplification stage coupled to amplify a difference between the filtered signal and the threshold;
a second amplification stage coupled to receive the amplified difference from the first amplification stage, the second amplification stage comprising a current mirror.

4. The data communications receiver of embodiment 4, wherein the current mirror has an input coupled to receive the amplified difference from the first amplification stage, wherein the current mirror comprises
  a first MOSFET having
    a control terminal,
    a first of the source/drain coupled to the input of the current amplification circuit, and
    a second of the source/drain coupled to a first reference potential, and
  a second MOSFET having
    a control terminal coupled to the input of the current amplification circuit,
    a first of the source/drain coupled to the output of the current amplification circuit, and
    a second of the source/drain coupled to a second reference potential,
wherein, in operation, the control terminal of the first MOSFET is biased so that the first MOSFET remains in a conductive state.

5. A data communications receiver comprising:
a receiver coil;
a first amplification stage coupled to the receiver coil, the first amplification circuitry to amplify a difference between
  a) at least part of signal received by the receiver coil and
  b) a threshold;
a current amplification circuit having an input coupled to receive the amplified difference from the first amplification stage, wherein the current amplification circuit comprises
  a first MOSFET having
    a control terminal,
    a first of the source/drain coupled to the input of the current amplification circuit, and
    a second of the source/drain coupled to a first reference potential, and
  a second MOSFET having
    a control terminal coupled to the input of the current amplification circuit,
    a first of the source/drain coupled to the output of the current amplification circuit, and
    a second of the source/drain coupled to a second reference potential,
wherein, in operation, the control terminal of the first MOSFET is biased so that the first MOSFET remains in a conductive state; and
hysteretic level shifting circuitry to shift a level of
  a) part of the filtered signal received by the receiver coil,
  b) the threshold, or
  c) both part of the filtered signal and the threshold such that, in response to the at least part of the signal received by the receiver coil having crossed the threshold, a threshold crossing in the other direction is delayed.

6. The data communications receiver of embodiment 3, wherein the first reference potential is the same as the second reference potential.

7. The data communications receiver of any one of embodiment 3 to 4, wherein the first reference potential is a negative supply potential of the data communications receiver.

8. The data communications receiver of embodiment 3, wherein the first reference potential is the least part of the signal received by the receiver coil.

9. The data communications receiver of any one of embodiments 3 to 6, wherein the control terminal of the first MOSFET is coupled to the input of the current amplification circuit.

10. The data communications receiver of embodiment 7, wherein the first and second MOSFETs form a linear current mirror.

11. The data communications receiver of any one of embodiments 1 to 2 and 6 to 11, further comprising filter circuitry coupled to filter low frequency components from the signal received by the receiver coil and output a filtered signal to the first amplification stage.

12. The data communications receiver of any one of embodiments 12 and 3 to 5, wherein the filter circuitry comprises a capacitance coupling the receiver coil to the first amplification stage.

13. The data communications receiver of embodiment 13, wherein the capacitance of the filter circuitry comprises a gate capacitance of a MOSFET.

14. The data communications receiver of any one of embodiments 12 to 14 and 3 to 5, wherein:
the filter circuitry comprises a resistance coupled to a reference potential; and
the hysteretic level shifting circuitry is to shift the level of the potential across the resistance.

15. The data communications receiver of embodiment 15, wherein the hysteretic level shifting circuitry comprises a variable current source coupled to output a variable current to shift the level of the potential across the resistance.

16. A data communications receiver according to any one of embodiments 1 to 2 and embodiment 4 to 16, wherein the first amplification stage comprises a common gate amplifier.

17. A data communications receiver according to embodiment 16, wherein the common gate amplifier comprises a first transistor having a source coupled to the threshold.

18. A data communications receiver according to any one of embodiments 16 to 17, wherein the first differential amplification stage comprises NMOS transistors.

19. A data communications receiver according to any preceding embodiment, further comprising a variable resistance coupled between an input of the common gate amplifier and a reference potential, wherein the hysteretic level shifting circuitry is coupled to vary the resistance of the variable resistance to shift the level of the threshold.

20. The data communications receiver of any preceding embodiment, wherein the threshold and the shift in the level are configured so that, for a transmitted signal having a duty cycle of 50%, a duty cycle of the amplified difference is between 35% and 65%, for example, between 40% and 60%.

21. A data communications receiver according to any preceding embodiment, further comprising an output circuit coupled to receive an amplified version of the difference between the at least part of signal received by the receiver coil and the threshold, wherein the output circuit is coupled to output a binary state signal representing the difference.

22. A data communications receiver according to embodiment 22, wherein the hysteretic level shifting circuitry shifts the level in response to a state change in the binary state signal.

23. A data communications receiver according to any preceding embodiment, wherein the hysteretic level shifting circuitry is to shift the level of at least part of the signal received by the receiver coil.

24. A data communications receiver according to any preceding embodiment, wherein the hysteretic level shifting circuitry is to shift the level in response to the signal having dropped below the threshold.

25. A data communications receiver according to any preceding embodiment, wherein the receiver coil comprises a portion of a lead frame.

26. A data communications receiver according to any preceding embodiment, wherein the receiver coil comprises a bondwire.

27. A data communications receiver according to any preceding embodiment, wherein the receiver coil comprises surface metallization.

28. A data communications receiver according to any preceding embodiment, wherein the receiver coil has an inductance of 50 nH or less, e.g., 20 nH or less.

29. A power converter comprising the data communications receiver according to any preceding embodiment.

30. The power converter of embodiment 30, further comprising:
a transmitter coil magnetically coupled to the receiver coil; and
a pulse generator coupled to output pulses across the transmitter coil.

31. The power converter of any one of embodiments 30 to 31, wherein the pulse generator is configured to generate pulses having a duration of 10 nS or less, e.g., 5 nS or less.

32. The power converter of any one of embodiments 30 to 32, wherein the transmitter coil has an inductance of 50 nH or less, e.g., 20 nH or less.

33. The controller of any one of embodiments 30 to 33, wherein the power converter comprises an insulated gate bipolar transistor power switch.

What is claimed is:

1. An analog receiver frontend, comprising:
a first amplification circuit coupled to receive an input signal, wherein the first amplification stage is coupled to amplify a difference between the input signal and a threshold to generate the first signal;
a second amplification circuit coupled to receive the first signal from the first amplification circuit, wherein the second amplification circuit is coupled to amplify the first signal to generate a second signal;
an output circuit coupled to receive the second signal from the second amplification circuit, wherein the output circuit is coupled to output a recovered signal wherein the recovered signal is a pulse waveform of high and low sections; and
an input hysteresis circuit coupled to the output circuit to receive the recovered signal and generate a hysteresis signal, wherein one or both of the input signal and the threshold are level shifted by the hysteresis signal in response to the recovered signal.

2. The analog frontend receiver of claim 1, wherein the second amplification circuit is further coupled to amplify and invert the first signal to generate the second signal.

3. The analog frontend receiver of claim 1, wherein the input hysteresis circuit is coupled to commence the level shifting of the input signal in response to an initial detection of a pulse in the recovered signal, wherein the level shifting increases a difference between the input signal and the threshold.

4. The analog frontend receiver of claim 1, further comprising a filter circuit coupled to the first amplification circuit to filter low frequency components of the input signal such that the input signal coupled to be received by the first amplification circuit is a filtered signal received from the filter circuit.

5. The analog frontend receiver of claim 1, wherein the first amplification circuit comprises:
  a first current source coupled to output a first current;
  a second current source coupled to output a second current;
  a first transistor having a drain coupled to receive the first current from the first current source, wherein the first transistor further includes a source coupled to receive the input signal;
  a second transistor having a drain coupled to receive the second current from the second current source, wherein the second transistor further includes a gate coupled to a drain of the second transistor and a gate of the first transistor; and
  a resistor coupled to a source of the second transistor, wherein the threshold is a voltage at a node between the resistor and the source of the second transistor, wherein the drain of the first transistor is coupled to output the first signal, wherein the first signal is representative of the first current minus a drain current of the first transistor.

6. The analog frontend receiver of claim 5, wherein the resistor is a variable resistor having a variable resistance controlled in response to the recovered signal.

7. The analog frontend receiver of claim 6, wherein the variable resistance is increased in response a high recovered signal.

8. The analog frontend receiver of claim 6, wherein the variable resistance is decreased in response to a low recovered signal.

9. The analog frontend receiver of claim 1, wherein the second amplification circuit comprises:
  a third current source coupled to output a third current;
  a third transistor having a drain coupled to receive the first input signal; and
  a fourth transistor having drain coupled to the third current source to receive the third current, wherein the fourth transistor further includes a gate coupled to a gate and the drain of the third transistor such that the third transistor and fourth transistor are coupled to form a current mirror.

10. The analog frontend receiver claim 9, wherein an amount of amplification of the current mirror is determined by a ratio of sizes (1:N) of the third transistor and the fourth transistor.

11. The analog frontend receiver of claim 1, wherein the output circuit comprises:
  a first inverter having an input coupled to the second amplifier circuit to receive the second signal; and
  a second inverter coupled to the first inverter to output the recovered signal.

12. The analog frontend receiver of claim 1, wherein the input hysteresis circuit comprises a controlled current source coupled to be controlled by an inverted recovered signal to generate the hysteresis signal, wherein the hysteresis signal is substantially zero when the inverted recovered signal is low, and wherein the hysteresis signal is substantially non-zero when the inverted recovered signal is high.

13. The analog frontend receiver of claim 1, wherein a pulse in the recovered signal is detected when the input signal falls below the threshold.

14. A method of receiving a signal, comprising:
  receiving an input signal;
  amplifying a difference between the input signal and a threshold to generate a first signal;
  amplifying the first signal to generate a second signal;
  inverting the second signal twice to generate a recovered signal in response to the second signal;
  generating a hysteresis signal in response to the recovered signal, wherein the hysteresis signal is substantially zero when the inverted recovered signal is low, and wherein the hysteresis signal is substantially non-zero when the inverted recovered signal is high, and
  level shifting one or both of the input signal and the threshold with the hysteresis signal in response to the recovered signal.

15. The method of claim 14, wherein said amplifying the first signal to generate the second signal comprises amplifying and inverting the first signal to generate the second signal.

16. The method of claim 14, wherein the level shifting of the input signal is commenced in response to an initial detection of a pulse in the recovered signal, wherein said level shifting comprises increasing a difference between the input signal and the threshold.

17. The method of claim 14, further comprising filtering the input signal to generate a filtered signal such the filtered signal is amplified to generate the second signal.

18. The method of claim 14, wherein the recovered signal is a pulse waveform of high and low sections of varying durations.

19. The method of claim 18, wherein a pulse in the recovered signal is detected when the input signal falls below the threshold.

* * * * *